United States Patent [19]
Laurent

[11] Patent Number: 5,800,880
[45] Date of Patent: Sep. 1, 1998

[54] PROCESS FOR COATING THE INTERIOR WALL OF A CONTAINER WITH A SIOX BARRIER LAYER

[75] Inventor: Jacques Laurent, Blonay, Switzerland

[73] Assignee: Tetra Laval Holdings & Finance, S.A., Pully, Switzerland

[21] Appl. No.: 824,157

[22] Filed: Mar. 26, 1997

[51] Int. Cl.$^6$ ............................ B05D 3/06; C23C 8/00
[52] U.S. Cl. ........................ 427/583; 427/237; 427/238; 427/255.3
[58] Field of Search ........................ 427/238, 237, 427/586, 255.3, 583, 585

[56] References Cited

U.S. PATENT DOCUMENTS

| | | |
|---|---|---|
| 4,374,157 | 2/1983 | Barbier. |
| 4,388,095 | 6/1983 | Schneider et al.. |
| 4,631,199 | 12/1986 | Hall et al.. |
| 4,684,553 | 8/1987 | Sasaki et al. .................. 428/35 |
| 4,753,818 | 6/1988 | Rogers, Jr.. |
| 5,171,610 | 12/1992 | Lin. |
| 5,378,510 | 1/1995 | Thomas et al.. |
| 5,510,155 | 4/1996 | Williams et al. .................. 427/579 |
| 5,521,351 | 5/1996 | Mahoney .................. 427/238 |
| 5,547,723 | 8/1996 | Williams et al. .................. 428/35.7 |
| 5,702,770 | 12/1997 | Martin .................. 427/238 |

FOREIGN PATENT DOCUMENTS 60-242049  5/1984  Japan.

*Primary Examiner*—Roy V. King
*Attorney, Agent, or Firm*—Michael A. Catania

[57] ABSTRACT

A process for creating a SiOx barrier layer on the interior wall of a container is disclosed in the present invention. A gas mixture consisting of an organosilicon precursor gas, an oxidizer gas and a carrier gas is introduced into a polymeric container. The gas mixture is then irradiated with ultraviolet light to create a reaction within the container. The reacted gas then coats the interior wall of the container with a SiOx barrier layer. The remainder of the gas mixture is then purged from the container. The gas mixture may also be utilized to blow mould a container. The polymeric container may be composed of polyethylene, polypropylene, copolymers of polypropylene, copolymers of polyethylene, polyethylene terphthalate, copolymers of polyethylene terphthalate or mixtures thereof. An excimer ultraviolet lamp is preferred to irradiate the gas mixture inside of the container. The process may be performed at a station on a manufacturing line, or at an off-line site.

7 Claims, 3 Drawing Sheets

PROCESS FOR COATING THE INTERIOR WALL OF A CONTAINER WITH A SIOX BARRIER LAYER

CROSS REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The present invention relates to a process for depositing a silicon oxide barrier layer on a substrate. Specifically, the present invention relates to a process for coating the interior walls of a container with a silicon oxide barrier layer.

2. Description of the Related Art

Containers for chemically sensitive materials such as food products traditionally have been made from inorganic materials such as glass. Glass containers are transparent and permit the consumer to view the contents prior to purchase of the product. Further, glass containers are impermeable to atmospheric gases such as oxygen and hence protect the product. However, glass containers are heavy, expensive and susceptible to breakage. Attempts have been made to maintain the good qualities of glass while avoiding the problems of using glass.

BRIEF SUMMARY OF THE INVENTION

One aspect of the present invention is a process for coating the interior surface of a container. The process includes a number of steps which begin with providing a polymeric container transparent to ultraviolet radiation. The container should have an exterior surface and an interior surface, and should be transparent to ultraviolet radiation. The next step is introducing a gas mixture into the polymeric container. The gas mixture includes an organosilicon precursor gas, an oxidizer gas and a carrier gas. The next step is irradiating the polymeric container and gas mixture therein with ultraviolet radiation for a sufficient time period to react the gas mixture to form a SiOx deposition on the interior surface of the polymeric container.

The polymeric container may be composed of a material selected from the group consisting of polyethylene, polypropylene, copolymers of polypropylene, copolymers of polyethylene, polyethylene terphthalate, copolymers of polyethylene terphthalate and mixtures thereof. The organosilicon precursor gas may be selected from the group consisting of organosilicones, organosiloxanes and combinations thereof. The oxidizer gas may be selected from the group consisting of oxygen ($O_2$) and nitrous oxide ($N_2O$). The carrier gas may be selected from the group consisting of nitrogen, argon and helium.

The step of irradiating the polymeric container and gas mixture may be accomplished by substantially surrounding the polymeric container with a plurality of ultraviolet radiation sources. The process may further include the step of blow molding a bottle by introducing the gas mixture into the polymeric container. The x in the formula SiOx may have a value in the range of approximately 1.5 to 2.5. The step of introducing the gas mixture into the container may be accomplished by a flow pump in flow communication with the polymeric container. The ultraviolet radiation may have a wavelength of 222 nanometers.

Another aspect of the invention is a polymeric container having a SiOx barrier layer deposited on the interior surface of the polymeric container. The polymeric container is fabricated in accordance with a process commencing with the step of providing a polymeric container transparent to ultraviolet radiation. The container has an exterior surface and an interior surface. The next step is flowing a gas mixture into the polymeric container. The gas mixture includes an organosilicon precursor gas, an oxidizer gas and a carrier gas. The next step is irradiating the exterior surface of the polymeric container and the gas mixture in the interior of the polymeric container with ultraviolet radiation for a sufficient time period to react the gas mixture to deposit a SiOx barrier layer on the interior surface of the polymeric container.

The SiOx barrier layer on the interior surface of the polymeric container may have a thickness of approximately 50 to 500 nanometers. The organosilicon precursor gas may be selected from the group consisting of organosilicones, organosiloxanes and combinations thereof. The polymeric container may be composed of a material selected from the group consisting of polyethylene, polypropylene, copolymers of polypropylene, copolymers of polyethylene, polyethylene terphthalate, copolymers of polyethylene terphthalate and mixtures thereof.

Another aspect of the present invention is a process for the internal deposition of a SiOx barrier layer on the interior surface of a polymeric container. The process commences with the step of providing a preformed polymeric container composed of material transparent to ultraviolet radiation, the polymeric container having an opening leading to a hollow interior. The next step is flowing a gas mixture through the opening and into the hallow interior of the polymeric container. The gas mixture includes an organosilicon precursor gas, an oxidizer gas and a carrier gas. The next step is reacting the gas mixture through irradiating the exterior surface of the polymeric container and the gas mixture in the interior of the polymeric container with ultraviolet radiation for a sufficient time period to deposit a SiOx barrier layer on the interior surface of the polymeric container.

Having briefly described this invention, the above and further objects, features and advantages thereof will be recognized by those skilled in the pertinent art from the following detailed description of the invention when taken in conjunction with the accompanying drawings.

BRIEF DESCRIPTION OF THE SEVERAL VIEWS OF THE DRAWINGS

Several features of the present invention are further described in connection with the accompanying drawings in which:

There is illustrated in FIG. 1 a flow chart diagram of the process of the present invention.

Figure 2:
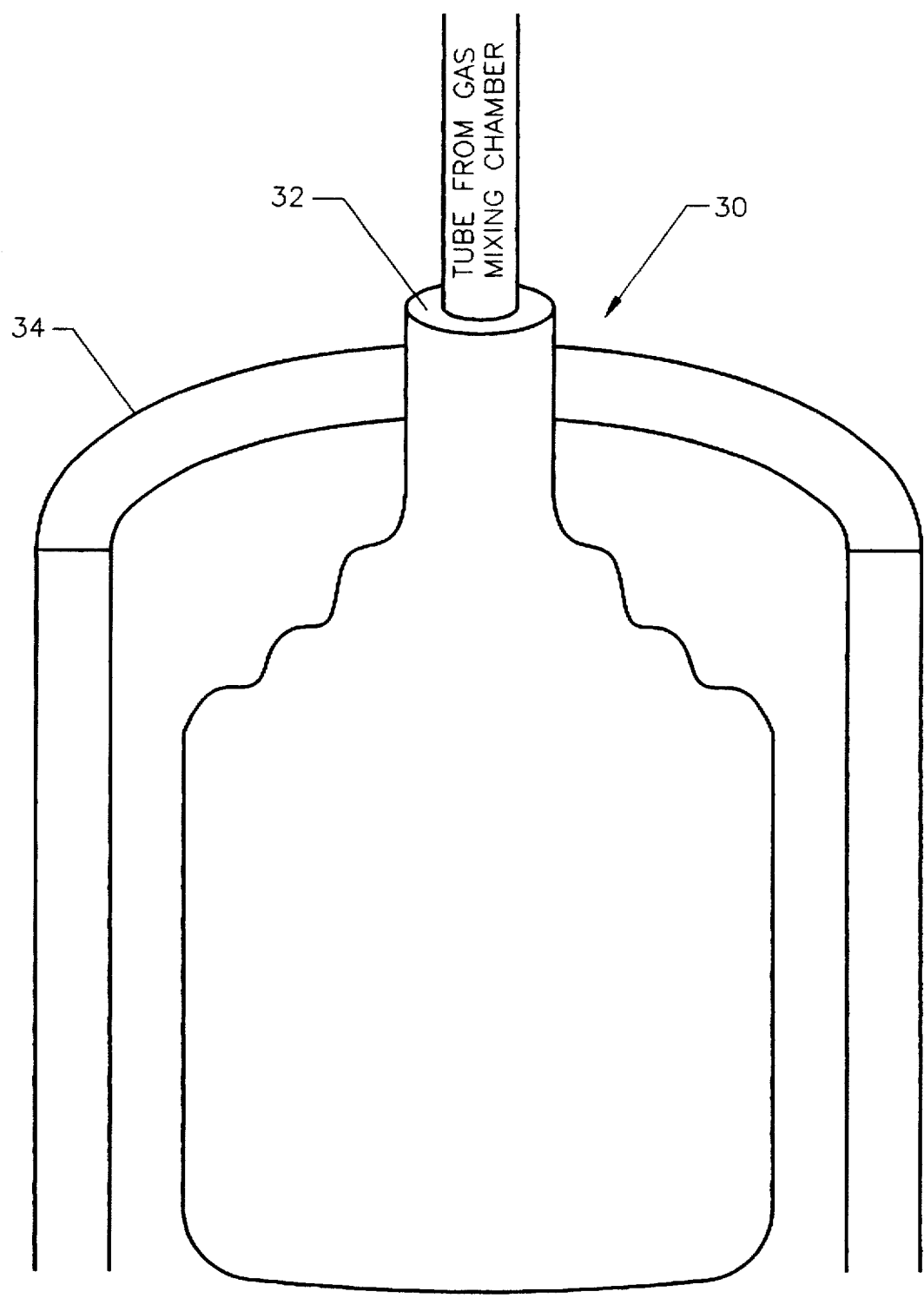

There is illustrated in FIG. 2 a perspective view of a container undergoing the coating process of the present invention.

Figure 3:
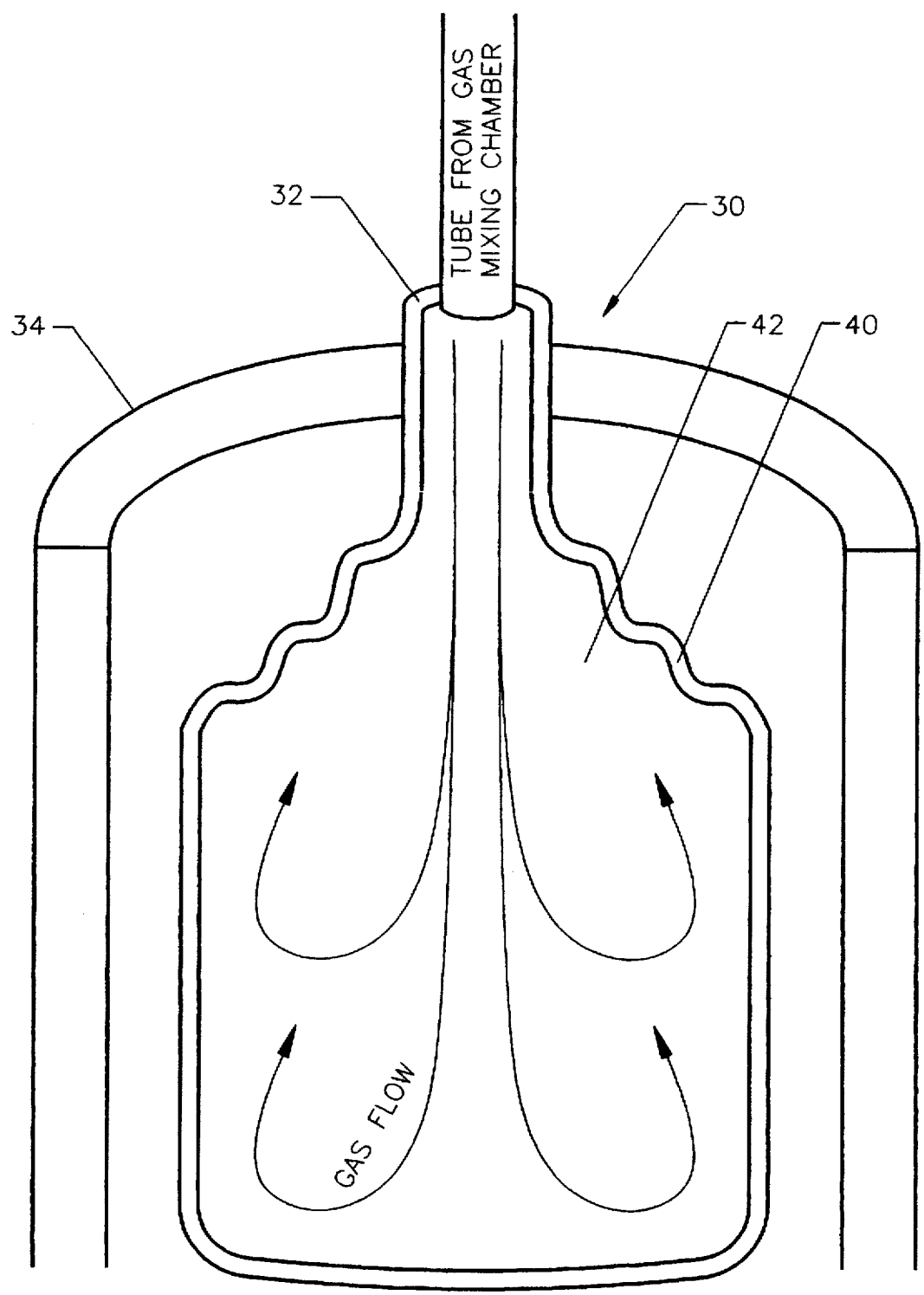

There is illustrated in FIG. 3 a cut-away view of a container with a silicon oxide layer deposited on the interior walls of the container through the process of the present invention.

DETAILED DESCRIPTION OF THE INVENTION

Figure 1:
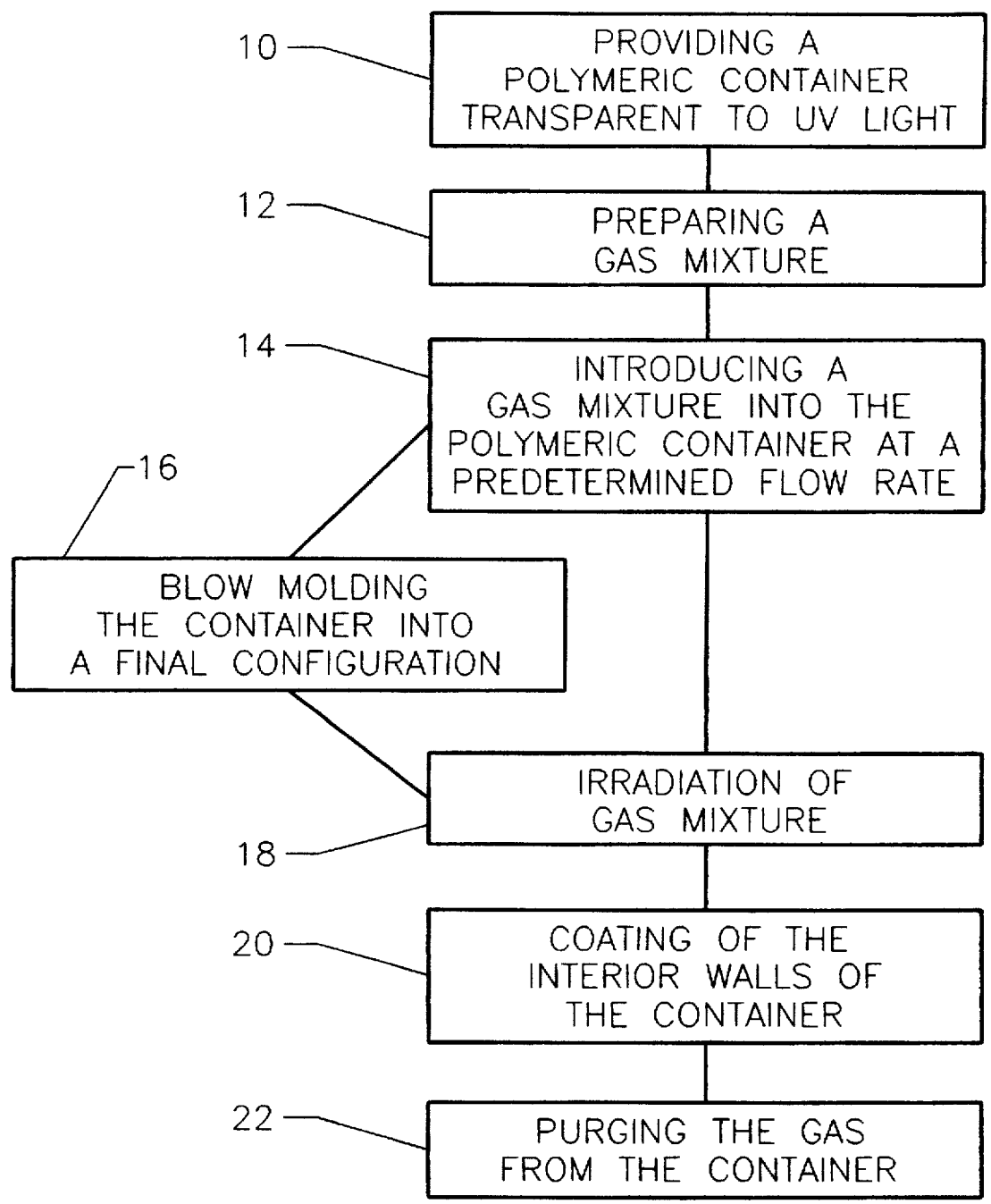

There is illustrated in FIG. 1 a flow chart diagram of the process of the present invention. As shown in FIG. 1, the first step of the process, step 10, is providing a polymeric container which is transparent to ultraviolet radiation. The container may be composed of a material such as polyethylene, polypropylene, copolymers of polypropylene, copolymers of polyethylene, polyethylene terphthalate, copolymers of polyethylene terphthalate or mixtures thereof. A preferred material for the polymeric container is polyethylene terphthalate. The polymeric container may be already formed into a final container shape or may be in a preform shape to be later blow molded into a final shape. At step 12, the gas mixture is prepared by mixing a organosilicon precursor gas with an oxidizer gas and a carrier gas. The organosilicon precursor gas may include one or more organosilicones, organosiloxanes, or combinations thereof. Lower alky, alkoxy, aryl and vinyl silanes and siloxanes are preferable, with hexamethyl disilanes and tetramethyl and hexamethyl disiloxanes of particular preference. The use of the designation "precursor gas" does not apply to the standard, pressure and temperature ("STP") state of the compound. The compounds may have a STP phase which is liquid, or even solid, however, during the process the precursor gas compound is transformed to the gas or vapor phase if necessary. The oxidizer gas may be nitrous oxide or oxygen. The carrier gas may be argon, nitrogen or helium. Each of the gases are supplied to a mixing chamber which is in flow communication with the source for each of the gases. Metering valves control the flow rate of each of the gases into the mixing chamber.

Specific quantities of the gases will vary depending on a number of factors. The most important of the factors are the desired thickness of the barrier layer, the stoichiometry of the barrier layer (the range between $SiO_{1.5}$ and $SiO_{2.5}$), the rate of deposition, the area to be coated including the size of the container and distribution of the coating inside of the container, the strength of the ultraviolet radiation and the material composition of the container.

At step 14 the gas mixture is introduced into the container. The gas may be introduced into the container through pumping the gas from a mixture location to the container via connective tubing. Alternatively, the containers may be placed in a chamber which is filled with the gas mixture. Those skilled in the art will recognize that the there are many methods of introducing the gas mixture into the container which are within the scope of the present invention.

If the container is only preformed and not in its final shape, at step 16 the container is blow molded into a final configuration through introduction of the gas mixture. In this manner, the pressure of the gas mixture inflates the preformed container to its final configuration. If the container is already in its final configuration prior to the introduction of the gas mixture, step 16 is disregarded and the process proceeds from step 14 to step 18. At step 18, the exterior of the container is irradiated with ultraviolet radiation thereby irradiating the gas mixture inside of the container since the material composition of the polymeric container must be transparent to ultraviolet radiation. At step 20, the interior wall of the container is coated with a SiOx barrier layer created from the irradiated gas mixture. A general description of the chemical reaction of irradiated gases, including an oxygen-containing precursor, is provided in Rogers, Jr., U.S. Pat. No. 4,753,818, entitled "Process For Photochemical Vapor Deposition Of Oxide Layers At Enhanced Deposition Rates" which pertinent parts are hereby incorporated by reference. At step 22, the remaining gas in the interior of the container is purged from the container. The process as described may be performed at a station on a manufacturing line for the containers, or at an off-line site.

There is illustrated in FIG. 2 a perspective view of a container undergoing a coating process of the present invention. FIG. 2 illustrates one possible configuration for the irradiation process. As shown in FIG. 2, a container 30 is substantially surrounded by a plurality of ultraviolet radiation sources 34. In a preferred embodiment, the ultraviolet radiation sources 34 are cylindrical excimer lamps which surround the container and emit ultraviolet radiation at a specified wavelength, preferably 222 nanometers. Alternatively, the ultraviolet radiation sources may be mercury lamps, each with a reflector attached on the opposite side from the container 30 in order to reflect ultraviolet radiation to the container 30. Ultraviolet radiation for purposes of the present invention is defined as wavelengths corresponding to the section of the electromagnetic spectrum between visible light and x-rays which approximately corresponds to wavelengths of 130 nanometers ("nm") to 290 nm.

EXCIMER ULTRAVIOLET TECHNOLOGY

In a preferred embodiment of the present invention, excimer ultraviolet technology is utilized to irradiate a gas mixture to form a SiOx barrier layer inside of a container. Excimers are evanescent, electronically excited molecular complexes which exist only under unique conditions. The excimer is in an excited state as opposed to a ground state. In this excited state, elements such as the noble gases which are normally unreactive, are able to bind to one another or to other elements. Excimers usually disintegrate within a microsecond of formation and emit their binding energy as a photon as the two elements return to the ground state. For ultraviolet applications, the excimers formed from noble gas atoms or excimers formed from a noble gas and a halogen are of particular importance. Some of the more well known ultraviolet excimers include $Ar_2$, $Kr_2$, $Xe_2$, ArCl, KrCl, KrF and XeCl. These molecular complexes are ultraviolet excimers because the disintegration of the excimer, excited dimer, results in an emission in the ultraviolet range of the electromagnetic spectrum. For example, the emission from KrCl has a wavelength of 222 nanometers ("nm"), the emission from KrF has a wavelength of 248 nanometers, the emission from $Xe_2$ has a wavelength of 172 nm, and the emission from XeCl has a wavelength of 308 nm. Although several ultraviolet excimers have been mentioned in reference to the present invention, those skilled in the pertinent art will recognize that other ultraviolet excimers may be employed in practicing the present invention without departing from the scope of the present invention.

An example of the excimer process for xenon is as follows. First, a xenon atom in the ground state is excited by interaction with an electron to an excited state. Next, this excited xenon atom reacts with a ground state xenon atom to form an excimer complex. Within a microsecond after formation, the xenon atoms dissociate to two ground state xenon atoms and doing so emit an ultraviolet photon.

The present invention may involve an excimer ultraviolet lamp in which a gas capable of forming excimers is hermetically sealed within a quartz glass shell. The gas may be a noble gas or a mixture of noble gas and a halogen. Electrons are generated by electrodes located outside of the shell and separated by a discharge gap. In a preferred embodiment of the present invention, the excimer ultraviolet lamp is cylindrical in shape having an aperture therethrough the center. In this embodiment, one electrode is juxtaposed to the exterior surface of the ultraviolet lamp while the second electrode is juxtaposed on the interior surface of the cylinder of the ultraviolet lamp.

Referring again to FIG. 2, the gas mixture flows into the container 30 through an opening 32. The irradiation of the gas mixture causes a reaction to take place in which the precursor gas is oxidized by the oxidizer gas thereby creating a compound which is prone to condense on the interior walls of the container thereby forming a SiOx barrier layer.

There is illustrated in FIG. 3 a cut-away view of a container with a silicon oxide layer deposited on the interior walls of the container through a process of the present invention. As shown in FIG. 3, the container 30 has a wall composed of a polymeric layer 40 and a SiOx barrier layer 42. The SiOx barrier layer 42 should cover the entire area of the interior surface of the container 30. The thickness of the SiOx barrier layer will vary depending on the application. A container 30 composed of one polymeric material may require a greater barrier protection than other polymeric materials. Additionally, the final product to be contained in the container 30 will be a factor in determining the thickness of the barrier layer 42. For example, the thickness of the barrier should be approximately 50 to 500 nanometers, however, the present invention should not be limited to this specific range.

The SiOx barrier layer is essentially inert with respect to all common chemicals and food ingredients. The SiOx barrier layer is also transparent and optically clear. Post-processing applications such as printing or application of adhesive labels are unaffected by the SiOx barrier layer since it is disposed on the interior surface of the container. The polymeric layer 40 also serves to protect the barrier layer 42 from damage such as abrasion in shipping and handling. The barrier layer 42 protects the contents from absorption of oxygen or other gases dissolved in the polymeric layer 40. The barrier layer 42 constitutes a minute percentage of the overall mass of the container 30. Thus, the container 30 may be recycled in a normal fashion.

From the foregoing it is believed that those skilled in the pertinent art will recognize the meritorious advancement of this invention and will readily understand that while the present invention has been described in association with a preferred embodiment thereof, and other embodiments illustrated in the accompanying drawings, numerous changes, modifications and substitutions of equivalents may be made therein without departing from the spirit and scope of this invention which is intended to be unlimited by the foregoing except as may appear in the following appended claims. Therefore, the embodiments of the invention in which an exclusive property or privilege is claimed are defined in the following appended claims.

I claim as my invention:

1. A process for coating the interior surface of a bottle, the process comprising the steps of:

providing a preform for a polymeric bottle, the preform having an opening for access to the interior of the preform, the preform transparent to ultraviolet radiation, the preform having an exterior surface and an interior surface;

introducing a gas mixture through the opening of the preform to blow mold a polymeric bottle, the gas mixture comprising an organosilicon precursor gas, an oxidizer gas and a carrier gas, wherein the organosilicon precursor gas is selected from the group consisting of organosilicones, organosiloxanes and combinations thereof; and irradiating the exterior surface of the polymeric bottle and gas mixture therein with ultraviolet radiation from an ultraviolet radiation source disposed proximate to and substantially surrounding the bottle for a sufficient time period to react the gas mixture to form a SiOx layer on the interior surface of the polymeric bottle wherein x of the SiOx layer has range of 1.5 to 2.5.

2. The process according to claim 1 wherein the polymeric bottle is composed of a material selected from the group consisting of polyethylene, polypropylene, copolymers of polypropylene, copolymers of polyethylene, polyethylene terphthalate, copolymers of polyethylene terphthalate and mixtures thereof.

3. The process according to claim 1 wherein the step of introducing the gas mixture is accomplished by a flow pump in flow communication with the opening of the preform.

4. The process according to claim 1 wherein the oxidizer gas is selected from the group consisting of oxygen ($O_2$) and nitrous oxide ($N_2O$).

5. The process according to claim 1 wherein the carrier gas is selected from the group consisting of nitrogen, argon and helium.

6. The process according to claim 1 wherein the ultraviolet radiation source is at least one excimer ultraviolet lamp emitting radiation at a wavelength within the ultraviolet range.

7. The process according to claim 6 wherein the excimer ultraviolet lamp is a KrCl ultraviolet lamp emitting radiation at a wavelength at 222 nm.

\* \* \* \* \*